United States Patent
Kurashima et al.

(10) Patent No.: US 9,059,088 B2
(45) Date of Patent: Jun. 16, 2015

(54) ELECTRONIC COMPONENT BUILT-IN SUBSTRATE

(71) Applicant: Shinko Electric Industries Co., Ltd., Nagano (JP)

(72) Inventors: Nobuyuki Kurashima, Nagano (JP); Tetsuya Koyama, Nagano (JP); Hajime Ilzuka, Nagano (JP); Koichi Tanaka, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 11 days.

(21) Appl. No.: 13/944,188

(22) Filed: Jul. 17, 2013

(65) Prior Publication Data

US 2014/0054773 A1    Feb. 27, 2014

(30) Foreign Application Priority Data

Aug. 27, 2012   (JP) .................. 2012-186065

(51) Int. Cl.
| | |
|---|---|
| *H01L 23/48* | (2006.01) |
| *H01L 23/52* | (2006.01) |
| *H01L 29/40* | (2006.01) |

(Continued)

(52) U.S. Cl.
CPC .......... *H01L 23/28* (2013.01); *H01L 23/49816* (2013.01); *H01L 23/3128* (2013.01); *H01L 21/565* (2013.01); *H01L 23/562* (2013.01); *H01L 2224/16225* (2013.01); *H01L 2224/32225* (2013.01); *H01L 2224/73204* (2013.01); *H01L 2924/15311* (2013.01); *H01L 2924/19105* (2013.01); *H01L 23/49822* (2013.01); *H01L 23/49827* (2013.01); *H01L 23/49833* (2013.01); *H01L 25/165* (2013.01); *H05K 1/14* (2013.01)

(58) Field of Classification Search
CPC ................ H01L 2924/01079; H01L 2924/14; H01L 25/0657; H01L 2224/48091; H01L 23/10; H01L 2224/16
USPC ......... 257/738, 685, 686, 723, 777, 730, 731, 257/733, 778, 783, 786, 787
See application file for complete search history.

(56) References Cited

U.S. PATENT DOCUMENTS

| | | | |
|---|---|---|---|
| 7,141,873 B2 * | 11/2006 | Aoyagi | ................... 257/686 |
| 7,989,707 B2 | 8/2011 | Yamano | |
| 2011/0256662 A1 * | 10/2011 | Yamano et al. | ............... 438/107 |

FOREIGN PATENT DOCUMENTS

| | | |
|---|---|---|
| JP | 2001-210954 A1 | 8/2001 |
| JP | 2004-165318 A1 | 6/2004 |
| JP | 2008-10885 A1 | 1/2008 |

*Primary Examiner* — A. Sefer
*Assistant Examiner* — Dilinh Nguyen
(74) *Attorney, Agent, or Firm* — Kratz, Quintos & Hanson, LLP

(57) ABSTRACT

An electronic component built-in substrate, includes a lower wiring substrate, an electronic component mounted on the lower wiring substrate, an intermediate wiring substrate including an opening portion in which the electronic component is mounted, and arranged in a periphery of the electronic component, and connected to the lower wiring substrate via a first conductive ball, an upper wiring substrate arranged over the electronic component and the intermediate wiring substrate, and connected to the intermediate wiring substrate via a second conductive ball, and a resin filled into respective areas between the lower wiring substrate, the intermediate wiring substrate, and the upper wiring substrate, and sealing the electronic component, wherein the first conductive ball and the second conductive ball are arranged in displaced positions mutually.

4 Claims, 10 Drawing Sheets

(51) Int. Cl.
  *H01L 23/02* (2006.01)
  *H01L 23/12* (2006.01)
  *H01L 23/28* (2006.01)
  *H01L 23/498* (2006.01)
  *H01L 21/56* (2006.01)
  *H05K 1/14* (2006.01)
  *H01L 23/31* (2006.01)
  *H01L 23/00* (2006.01)
  *H01L 25/16* (2006.01)

ELECTRONIC COMPONENT BUILT-IN SUBSTRATE

CROSS-REFERENCE TO RELATED APPLICATIONS

This application is based upon and claims the benefit of priority of the prior Japanese Patent Application No. 2012-186065, filed on Aug. 27, 2012, the entire contents of which are incorporated herein by reference.

FIELD

It is related to an electronic component built-in substrate and a method of manufacturing the same.

BACKGROUND

With recent advances of electronic equipment, in the wiring substrate in the electronic component device used for the electronic equipment, the miniaturization and the higher performance, etc. are demanded. In order to respond to such demands, the electronic component built-in substrate in which the electronic component is built in the wiring substrate have already been put to practical utilization.

In one example of such electronic component built-in substrates, the upper wiring substrate is stacked on the lower wiring substrate on which the semiconductor chip, or the like is mounted via the bump electrodes, and then a molding resin for sealing the semiconductor chip is filled into a clearance between the lower wiring substrate and the upper wiring substrate.

A related art is disclosed in Japanese Laid-open Patent Publication No. 2008-10885, Japanese Laid-open Patent Publication No. 2001-210954, and Japanese Laid-open Patent Publication No. 2004-165318.

As explained in the column of the preliminary matter described later, in the electronic component built-in substrate in which the upper wiring substrate is stacked on the lower wiring substrate, on which the semiconductor chip, or the like is mounted, via the solder balls, it is necessary to set a diameter of the solder ball larger than a height of the semiconductor chip. Therefore, to the demand that a quantity of signal is increased with the higher performance of the semiconductor chip, it is difficult to narrow an arrangement pitch by making a diameter of the solder balls small.

Also, when a molding resin is filled into an area between the lower and upper wiring substrates, in the case that an interval between the molding dies is wider than the designed value, the lower and upper wiring substrates are forced to expand. Thus, the solder balls are separated from the lower wiring substrate, and thereby the electrical connection between the lower and upper wiring substrates becomes open.

Conversely, in the case that an interval between the molding dies located to the lower side and the upper side is narrower than the designed value, since the upper wiring substrate is pushed downward more than the necessity, the solder balls are crashed.

SUMMARY

According to one aspect discussed herein, there is provided an electronic component built-in substrate, which includes a lower wiring substrate, an electronic component mounted on the lower wiring substrate, an intermediate wiring substrate including an opening portion in which the electronic component is mounted, and arranged in a periphery of the electronic component, and connected to the lower wiring substrate via a first conductive ball, an upper wiring substrate arranged over the electronic component and the intermediate wiring substrate, and connected to the intermediate wiring substrate via a second conductive ball, and a resin filled into respective areas between the lower wiring substrate, the intermediate wiring substrate, and the upper wiring substrate, and sealing the electronic component, wherein the first conductive ball and the second conductive ball are arranged in displaced positions mutually.

Also, according to another aspect discussed herein, there is provided a method of manufacturing an electronic component built-in substrate, which includes mounting an electronic component on a lower wiring substrate, obtaining a stacked wiring substrate having a structure that an intermediate wiring substrate in which an opening portion housing the electronic component is provided, is connected to the lower wiring substrate via a first conductive ball, and that an upper wiring substrate is connected to the intermediate wiring substrate via a second conductive ball, sealing the electronic component by filing a resin into respective areas between the lower wiring substrate, the intermediate wiring substrate, and the upper wiring substrate, and wherein the first conductive ball and the second conductive ball are arranged in displaced positions mutually.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENT

An embodiment will be explained with reference to the accompanying drawings hereinafter.

Figure 1:
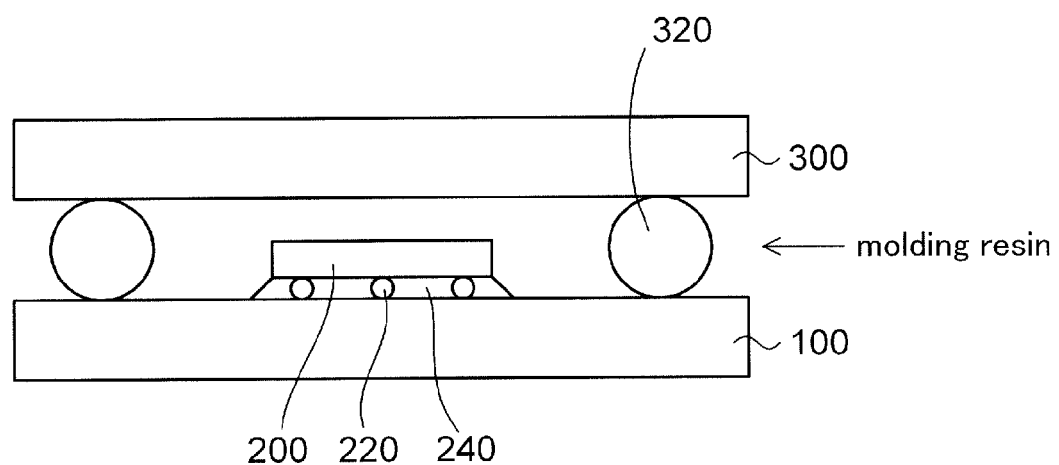
FIG. 1 is a sectional view depicting a method of manufacturing an electronic component built-in substrate according to the preliminary matter.

Prior to the explanation of an embodiment, the preliminary matter to be set forth as a basis will be explained hereunder. In a method of manufacturing an electronic component built-in substrate according to the preliminary matter, as depicted in FIG. 1, first, bump electrodes 220 of a semiconductor chip 200 are flip-chip connected to connection pads (not shown) of a lower wiring substrate 100. Then, an underfill resin 240 is filled into a clearance located to the lower side of the semiconductor chip 200.

Then, an upper wiring substrate 300 is electrically connected to the lower wiring substrate 100 via solder balls 320. By this matter, it is in a state that the semiconductor chip 200 is housed in an area between the lower wiring substrate 100 and the upper wiring substrate 300.

In recent years, a quantity of signal is going to increase with higher performance and higher integration of the semiconductor chip 200. For this reason, it is necessary that the arrangement pitch of respective connection parts of the lower wiring substrate 100 and the upper wiring substrate 300 are made narrower to make the number of connection path increase.

In order to respond to this need, in the structure of the wiring substrate in FIG. 1, it is necessary to perform the narrower pitch of the connection parts by arranging the solder balls 320 such that the diameter of solder balls 320 is made small to make the number of the balls increase.

However, it is necessary to set the diameter of the solder ball 320 larger than the height of the semiconductor chip 200. To thin the thickness of the semiconductor chip 200 has a limit. Therefore, it becomes extremely difficult to make the arrangement pitch of the solder balls 320 further narrow between the lower wiring substrate 100 and the upper wiring substrate 300.

Further, in the next step, the semiconductor chip 200 is sealed by filling a molding resin into an area between the lower wiring substrate 100 and the upper wiring substrate 300 in FIG. 1.

Figure 2A:
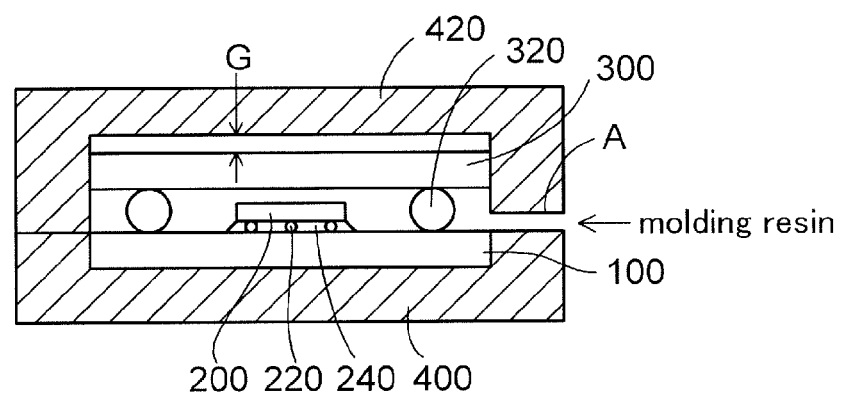
FIGS. 2A and 2B are sectional views (#1) for explaining the problem of the method of manufacturing the electronic component built-in substrate according to the preliminary matter.

In the step of filling the molding resin, as depicted in FIG. 2A, the lower and upper wiring substrates 100, 300 are arranged between a lower die 400 and an upper die 420, and then a melted molding resin is injected from a resin supply portion A to the area between the lower and upper wiring substrates 100, 300.

Figure 2B:
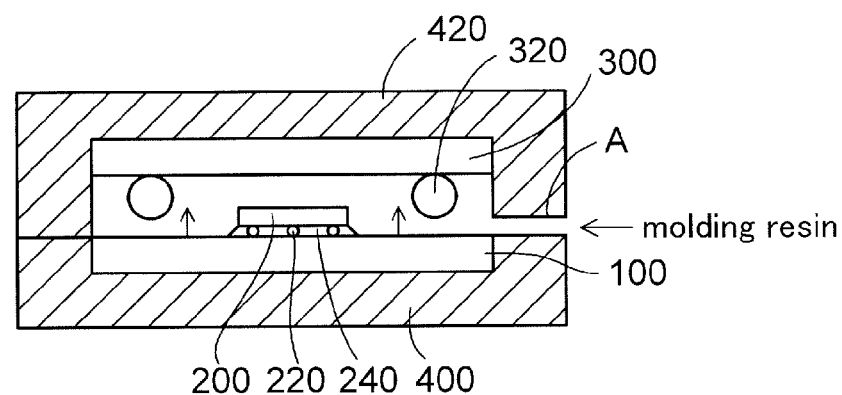

At this time, as in FIG. 2A, in the case that the interval between the lower die 400 and the upper die 420 is wider than the designed value, it is in a state that a clearance G is produced between the upper wiring substrate 300 and the upper die 420. In this case, as depicted in FIG. 2B, the lower and upper wiring substrates 100, 300 are forced to extend by a pressure applied at the time of injecting a molding resin. As a result, such a problem arises that the solder balls 320 are separated from the lower wiring substrate 100, and thus the electrical connection between the lower and upper wiring substrates 100, 300 becomes open.

In particular, in the situation that a clearance G in about 20 μm or more is produced between the upper wiring substrate 300 and the upper die 420, the solder balls 320 are easily separated from the lower wiring substrate 100 at the time of injecting a molding resin.

Figure 3A:
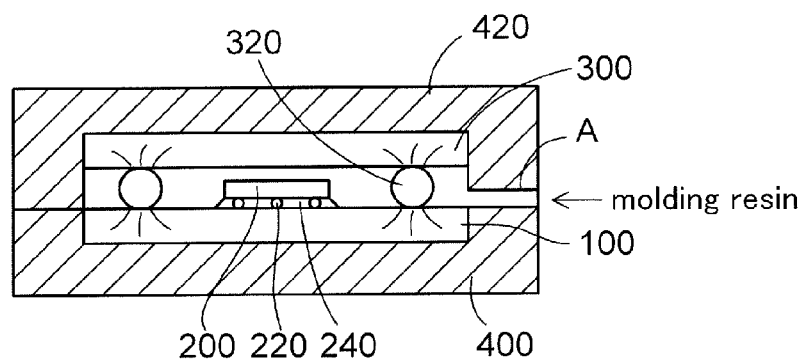
FIGS. 3A and 3B are sectional views (#2) for explaining the problem of the method of manufacturing the electronic component built-in substrate according to the preliminary matter.

Also conversely to this, as depicted in FIG. 3A, in the case that the interval between the lower die 400 and the upper die 420 is narrower than the designed value, since the upper wiring substrate 300 is pushed downward more than the necessity by the upper die 420, the solder balls 320 are crashed.

Figure 3B:
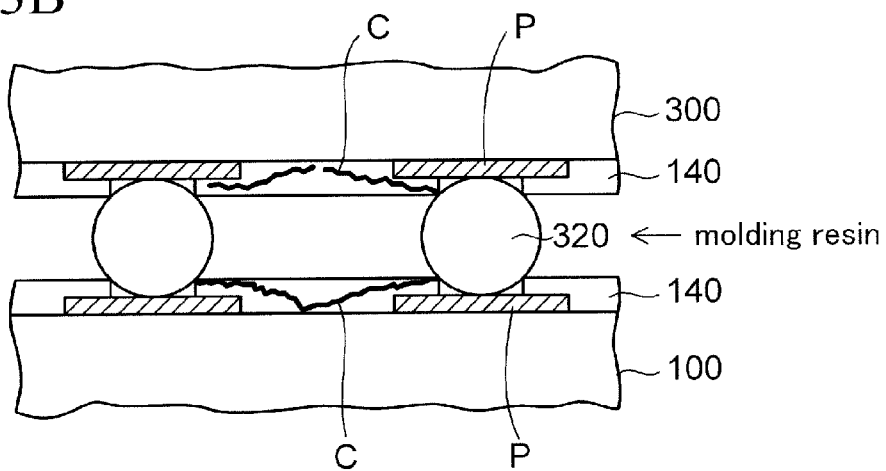

As depicted in FIG. 3B, when enlarging the solder balls 320 and their periphery in FIG. 3A, the lower and upper wiring substrates 100, 300 have a solder resist 140 in which opening portions 140a are provided on connection pads P. Then, the solder ball 320 is mounted between the connection pads P arranged on the upper and lower sides.

When the upper wiring substrate 300 is pushed to an extent that the solder balls 320 are crashed, a crack C is generated in the solder resists 140 which contact the solder balls 320.

In the later step, when the solder electrodes of the semiconductor device are connected to connection pads on the upper surface side of the upper wiring substrate 300 by means of the reflow heating, the solder balls 320 between the lower and upper wiring substrates 100, 300 are melted again. When the solder balls 320 are melted again, the solder flows in along the cracks C generated in the solder resists 140. Therefore, there exists such a problem that the adjacent solder balls 320 are electrically short-circuited.

According to an embodiment explained hereunder, the above-mentioned drawbacks can be solved.

(Embodiment)

Figure 9A:
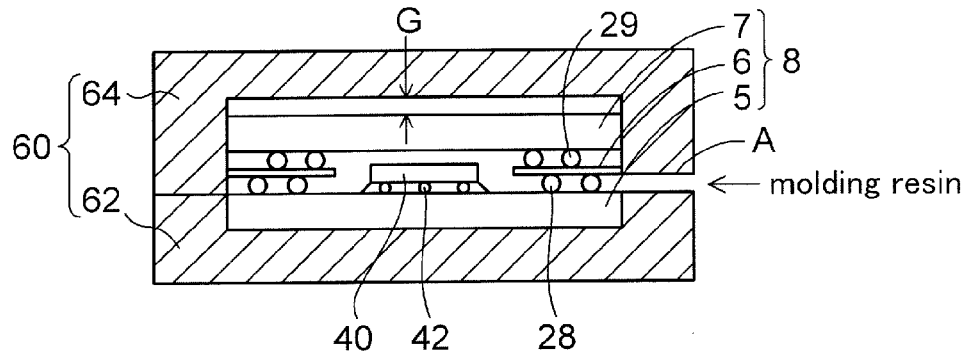
FIGS. 9A and 9B are sectional views (#1) depicting a state that the intermediate wiring substrate is deformed in molding die when the molding resin in FIG. 8 is formed.
Figure 9B:
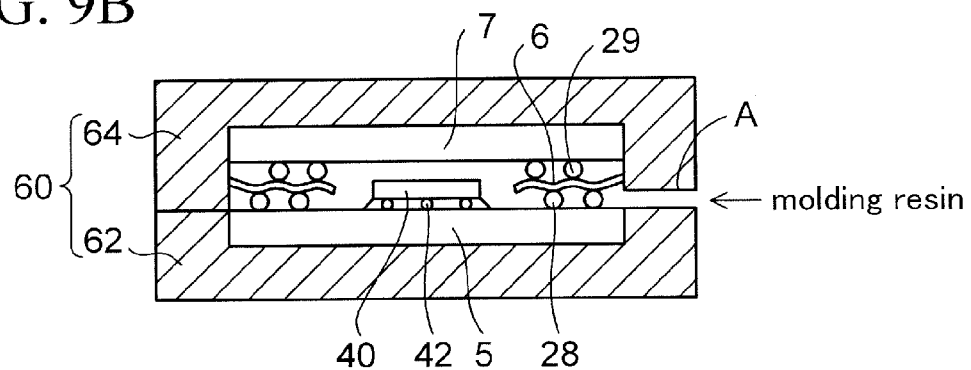
Figure 10:
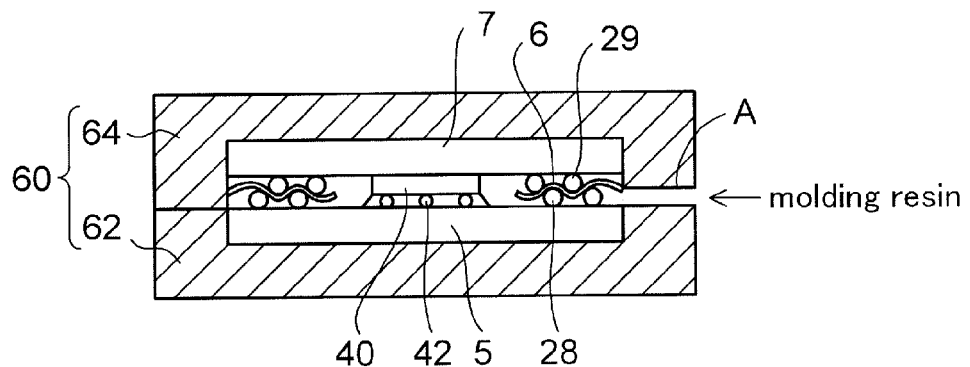
FIG. 10 is a sectional view (#2) depicting a state that the intermediate wiring substrate is deformed in molding die when the molding resin in FIG. 8 is formed.
Figure 11:
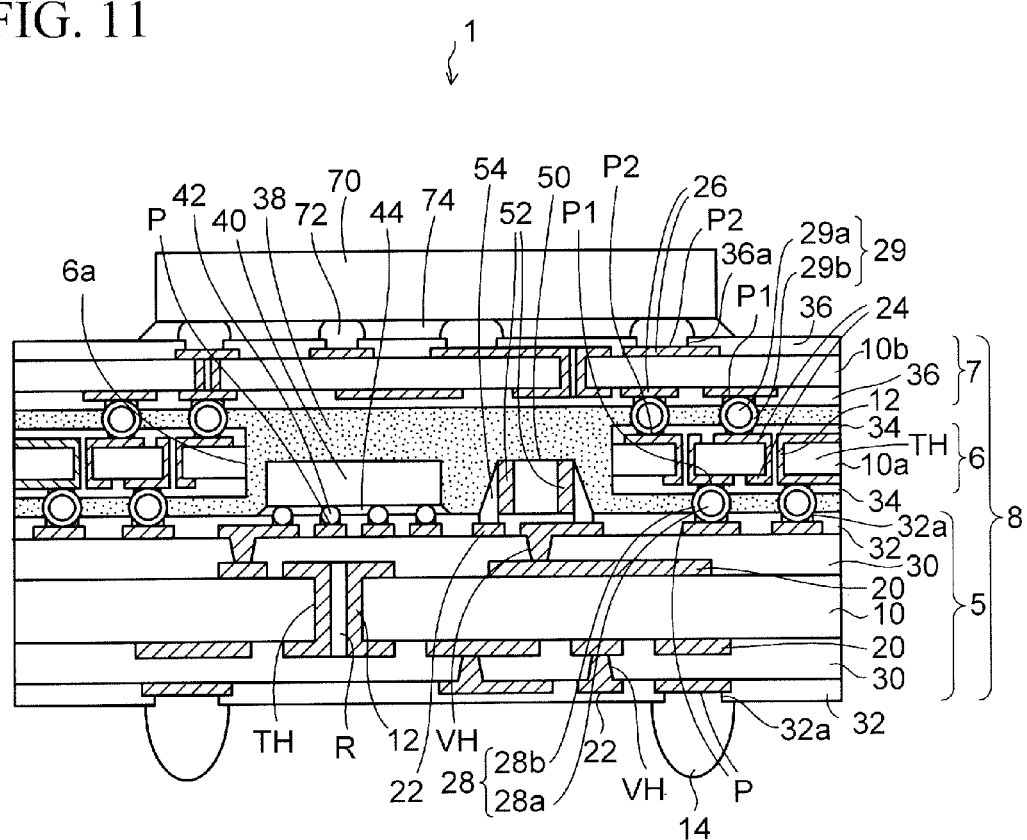
FIG. 11 is a sectional view depicting the electronic component built-in substrate according to the embodiment.

FIG. 4A to FIG. 10 are views for explaining a method of manufacturing an electronic component built-in substrate according to an embodiment, and FIG. 11 is a view depicting an electronic component built-in substrate according to an embodiment.

Figure 4A:
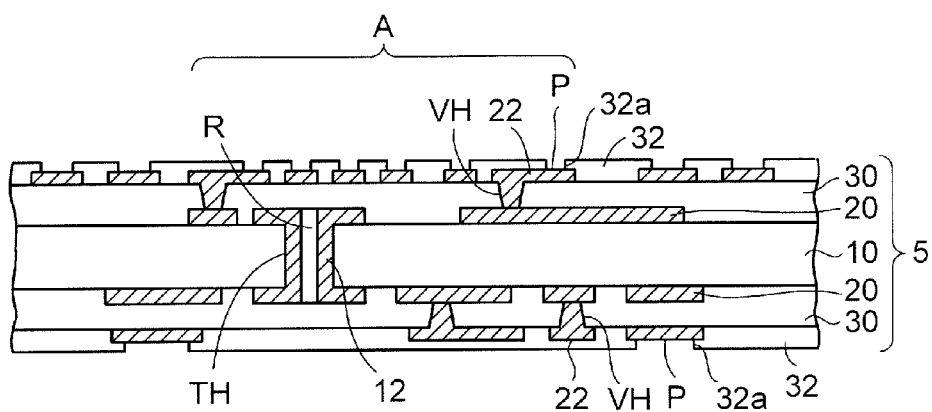
FIGS. 4A and 4B are sectional views (#1) depicting a method of manufacturing an electronic component built-in substrate according to an embodiment.

In a method of manufacturing an electronic component built-in substrate according to an embodiment, as depicted in FIG. 4A, a lower wiring substrate 5 is prepared. In the lower wiring substrate 5, a core substrate 10 is arranged in the center part in the thickness direction. The core substrate 10 is formed of insulating material such as a glass epoxy resin, or the like, for example.

A first wiring layer 20 made of copper, or the like is formed on both surface sides of the core substrate 10 respectively. Through holes TH each penetrating through in the thickness direction are provided in the core substrate 10.

The first wiring layer 20 on both surface sides is mutually connected via a through-hole plating layer 12 which is formed on an inner wall of the through hole TH. A resin R is filled in a remaining hole of the through hole TH. Alternatively, the penetrating electrode may be formed by filling the through hole TH of the core substrate 10 with a metal, thereby the first wiring layers 20 on both surface sides may be mutually connected via the penetrating electrode.

An interlayer insulating layer 30 covering the first wiring layer 20 is formed on both surface sides of the core substrate 10 respectively. The interlayer insulating layer 30 is formed of an epoxy resin, a polyimide resin, or the like. Via holes VH each reaching the connection part of the first wiring layer 20 are formed in the interlayer insulating layer 30 on both surface sides respectively.

Further, second wiring layers 22 each connected to the first wiring layer 20 via a via conductor which is filled in the via hole VH, are formed on the interlayer insulating layer 30 on both surface sides respectively.

Also, a solder resist 32 in which opening portions 32a are provided on connection pads P of the second wiring layers 22 is formed on the interlayer insulating layer 30 and the second wiring layers 22 on both surface sides of the core substrate 10 respectively.

In the case that the large size lower wiring substrate 5 for the purpose of multiple production is used, a plurality of product areas are demarcated on the substrate. In FIG. 4A, one product area of the lower wiring substrate 5 is depicted, and a component mounting area A is demarcated in its center part.

In the example of the lower wiring substrate 5 in FIG. 4A, the first and second wiring layers 20, 22 are stacked as double layers on both surface sides of the core substrate 10 respectively. In this case, the number of stacked layers of the wiring layers can be set arbitrarily. Also, the lower wiring substrate 5 may be formed as a coreless substrate that uses a polyimide tape, or the like as a base material and has flexibility.

Figure 4B:
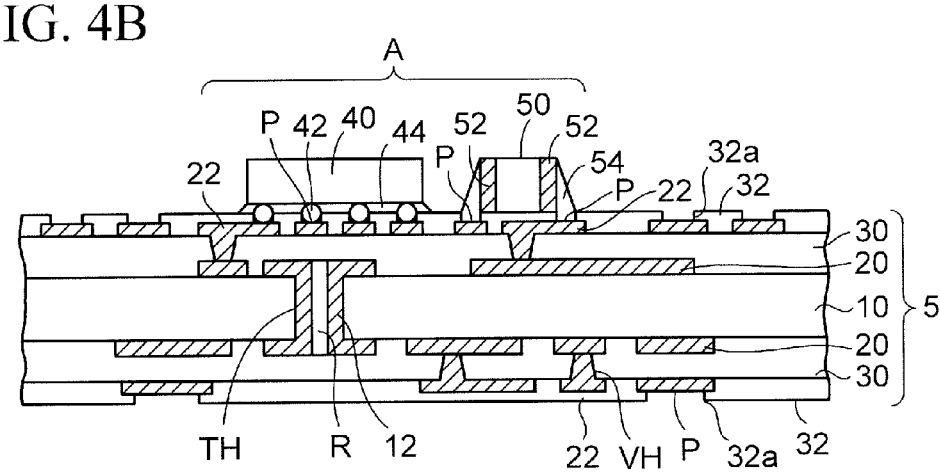

Then, as depicted in FIG. 4B, a semiconductor chip 40 which has bump electrodes 42 on the element forming face side is prepared. Then, the bump electrodes 42 of the semiconductor chip 40 are flip-chip connected to the connection pads P of the second wiring layers 22 in the component mounting area A of the lower wiring substrate 5. After this, an underfill resin 44 is filled into a clearance located under the semiconductor chip 40.

Further, similarly as depicted in FIG. 4B, a chip capacitor 50 is prepared. Then, the chip capacitor 50 is adhered onto the solder resist 32, which is located to the lateral direction of the semiconductor chip 40, on the upper surface side of the lower wiring substrate 5. The chip capacitor 50 has a connection terminal 52 on both end sides of the lateral direction. The connection terminals 52 located to both end sides are arranged in the parallel direction with the surface of the lower wiring substrate 5.

Further, the connection terminal 52 on both end sides of the chip capacitor 50 is electrically connected to the connection pads P of the second wiring layers 22 by a solder layer 54 respectively.

In this manner, the semiconductor chip 40 and the chip capacitor 50 are mounted side by side in the component mounting area A on the upper surface side of the lower wiring substrate 5.

As the electronic component, the semiconductor chip 40 and the chip capacitor 50 are illustrated herein. Besides these components, various electronic components such as a resistor element, an inductor element, etc. can be used.

Figure 5A:
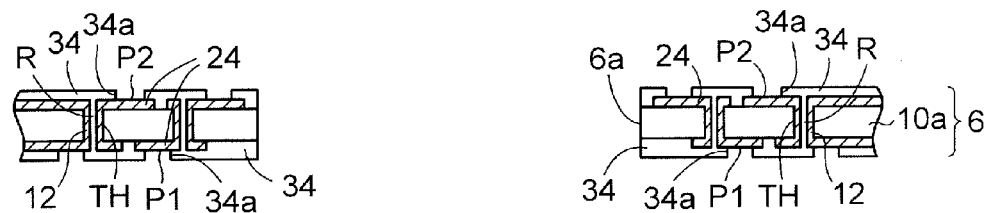
FIGS. 5A and 5B are sectional views (#2) depicting the method of manufacturing the electronic component built-in substrate according to the embodiment.

Then, as depicted in FIG. 5A, an intermediate wiring substrate 6 is prepared. The intermediate wiring substrate 6 has a frame-like structure in which an opening portion 6a penetrating from the upper surface to the lower surface is provided in the center part. The opening portion 6a of the intermediate wiring substrate 6 corresponds to the above component mounting area A of the lower wiring substrate 5, and the area of this opening portion 6a is set one size larger than the area of the component mounting area A.

In the intermediate wiring substrate 6, a wiring layer 24 is formed on both surface sides of a core substrate 10a. The core substrate 10a is formed of insulating material such as a glass epoxy resin, or the like, for example. The through holes TH penetrating in the thickness direction are provided in the core substrate 10a. The wiring layers 24 on both surface sides are mutually connected via the through-hole plating layer 12 formed on the inner wall of the through hole TH.

The resin R is filled in remaining holes of the through holes TH. Similarly to the above-mentioned lower wiring substrate 5, the wiring layers 24 on both surface sides of the core substrate 10a may be mutually connected via the penetrating electrode formed in the through hole TH.

A solder resist 34 in which opening portions 34a are provided on first connection pads P1 of the wiring layer 24 is formed on the lower surface side of the core substrate 10a.

Similarly, the solder resist 34 in which the opening portions 34a are provided on second connection pads P2 of the wiring layer 24 is formed on the upper surface side of the core substrate 10a.

Alternatively, the intermediate wiring substrate 6 may be formed as a coreless substrate that uses a polyimide tape, or the like as a base material and has flexibility.

Figure 5B:
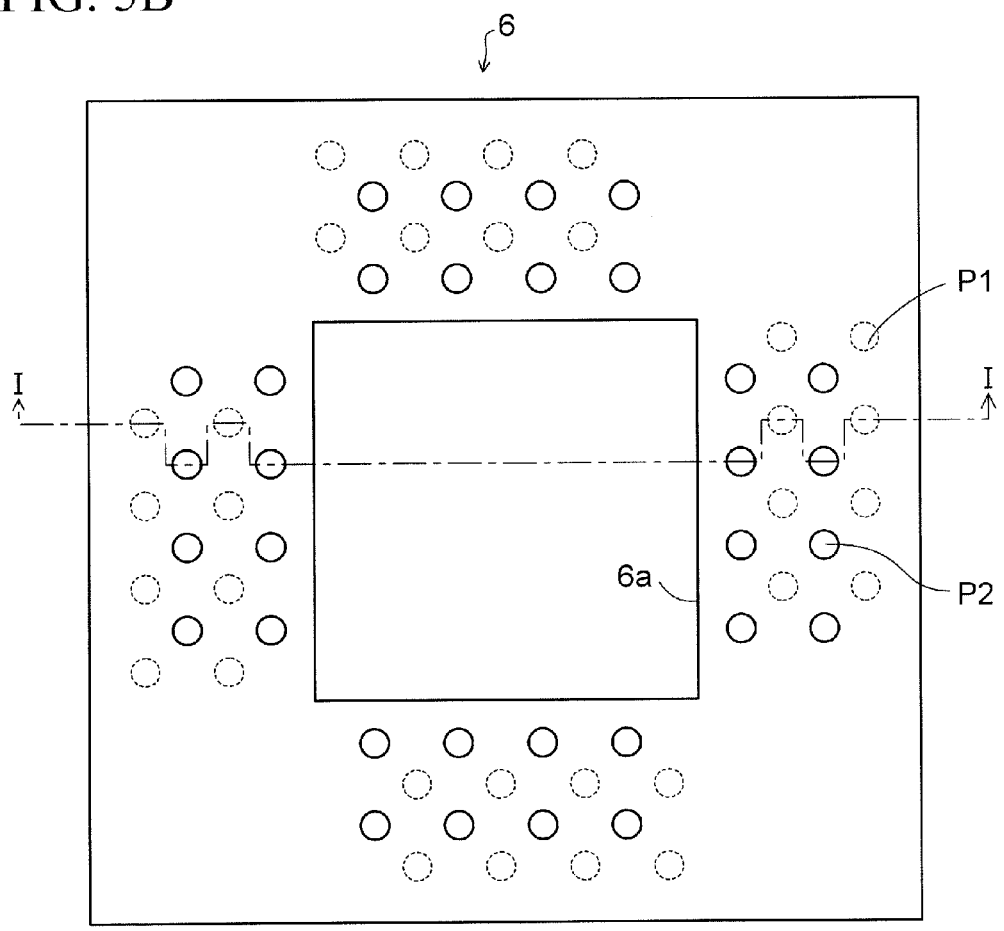

FIG. 5B is a plan view depicted when the intermediate wiring substrate 6 in FIG. 5A is viewed from the top. A sectional view of FIG. 5A corresponds to a section taken along I-I in FIG. 5B. In FIG. 5B, only first and second connection pads P1, P2 of the intermediate wiring substrate 6 are depicted, and the other elements are omitted herein.

By reference to a plan view of FIG. 5B together with FIG. 5A, the first connection pads P1 on the lower surface side of the intermediate wiring substrate 6 and the second connection pads P2 on the upper surface side thereof are arranged in mutually displaced positions. In FIGS. 5A and 5B, as the preferred example, when viewed from the top, the first connection pads P1 and the second connection pads P2 are arranged in the positions that are not mutually overlapped and are arranged like a staggered arrangement.

Any pad arrangements are available if the first connection pads P1 and the second connection pads P2 are arranged in the mutually displaced positions. Besides the example in FIG. 5B, the first connection pads P1 and the second connection pads P2 may be arranged to be displaced in such a state that these connection pads are partially overlapped with each other.

Also, in the example in FIG. 5B, the first connection pads P1 and the second connection pads P2 on the lower and upper surface sides are arranged in two lines respectively. But the number of arrangement can be set arbitrarily.

Figure 6A:
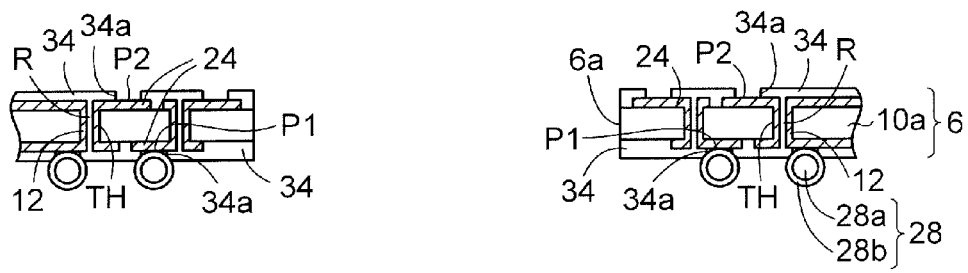
FIGS. 6A and 6B are sectional views (#3) depicting the method of manufacturing the electronic component built-in substrate according to the embodiment.

Then, as depicted in FIG. 6A, a first solder ball 28 is mounted on the first connection pads P1 on the lower surface side of the intermediate wiring substrate 6 respectively. Then, the first solder balls 28 are joined to the first connection pads P1 by applying the reflow heating. The first solder ball 28 is one example of the conductive balls.

In FIG. 6A, as the preferred example, the first solder ball 28 is formed by coating a solder layer 28b on an outer face of a copper core ball 28a. Alternatively, as the solder ball, the ball which is formed by coating a solder layer on an outer face of a resin core ball may be used.

Otherwise, in the case that no harm is caused even when an interval between the stacked substrates is slightly varied, a solder ball formed of the solder over the whole may be used as the solder ball. In this manner, as the example of the conductive ball, the solder ball at least an outer face of which is formed of the solder layer can be used.

Figure 6B:
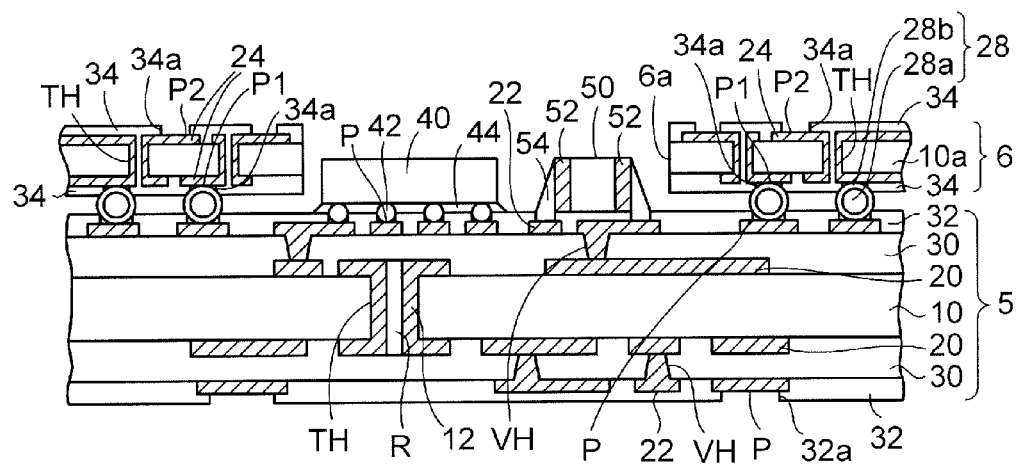

Then, as depicted in FIG. 6B, the first solder balls 28 on the lower surface side of the intermediate wiring substrate 6 in FIG. 6A are arranged on the connection pads P on the upper surface side of the above lower wiring substrate 5 in FIG. 4B, and then the reflow heating is applied. By this matter, the first solder balls 28 of the intermediate wiring substrate 6 are joined to the connection pads P of the lower wiring substrate 5, and thus both members are electrically connected mutually.

Consequently, it is in a state that the semiconductor chip 40 and the chip capacitor 50 are mounted in the opening portion 6a of the intermediate wiring substrate 6.

Here, the intermediate wiring substrate 6 linked like a frame is illustrated. In this case, the intermediate wiring substrate 6 may be arranged around the semiconductor chip 40 and the chip capacitor 50 in a state that the intermediate wiring substrate 6 is divided into plural parts.

Figure 7A:
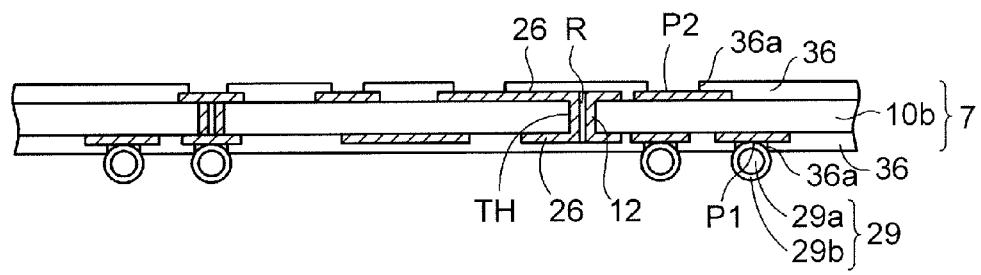
FIGS. 7A and 7B are sectional views (#4) depicting the method of manufacturing the electronic component built-in substrate according to the embodiment.

Subsequently, as depicted in FIG. 7A, an upper wiring substrate 7 is prepared. In the upper wiring substrate 7, wiring layers 26 are formed on both surface sides of a core substrate 10*b* respectively. The core substrate 10*b* is formed of insulating material such as a glass epoxy resin, or the like, for example. The through holes TH penetrating in the thickness direction are provided in the core substrate 10*b*.

The wiring layers 26 on both surface sides are mutually connected via the through-hole plating layer 12 which is formed on the inner wall of the through hole TH. The resin R is filled in the remaining hole of the through hole TH.

Similarly to the above-mentioned lower wiring substrate 5, the wiring layers 26 on both surface sides of the core substrate 10*b* may be mutually connected via the penetrating electrode which is formed in the through hole TH.

A solder resist 36 in which opening portions 36*a* are provided on the first connection pads P1 of the wiring layers 26 is formed on the lower surface side of the core substrate 10*b*. Similarly, the solder resist 36 in which the opening portions 36*a* are provided on the second connection pads P2 of the wiring layers 26 is formed on the upper surface side of the core substrate 10*b*.

Similarly to the lower wiring substrate 5 and the intermediate wiring substrate 6, the upper wiring substrate 7 may also be formed as a coreless substrate having the flexible property.

Then, a second solder ball 29 is mounted on the first connection pads P1 on the lower surface side of the upper wiring substrate 7 respectively, and then the second solder balls 29 are joined to the first connection pads P1 by applying the reflow heating. Similarly to the above-mentioned first solder balls 28, preferably the second solder ball 29 is formed by coating a solder layer 29*b* on an outer face of a copper core ball 29*a*.

Figure 7B:
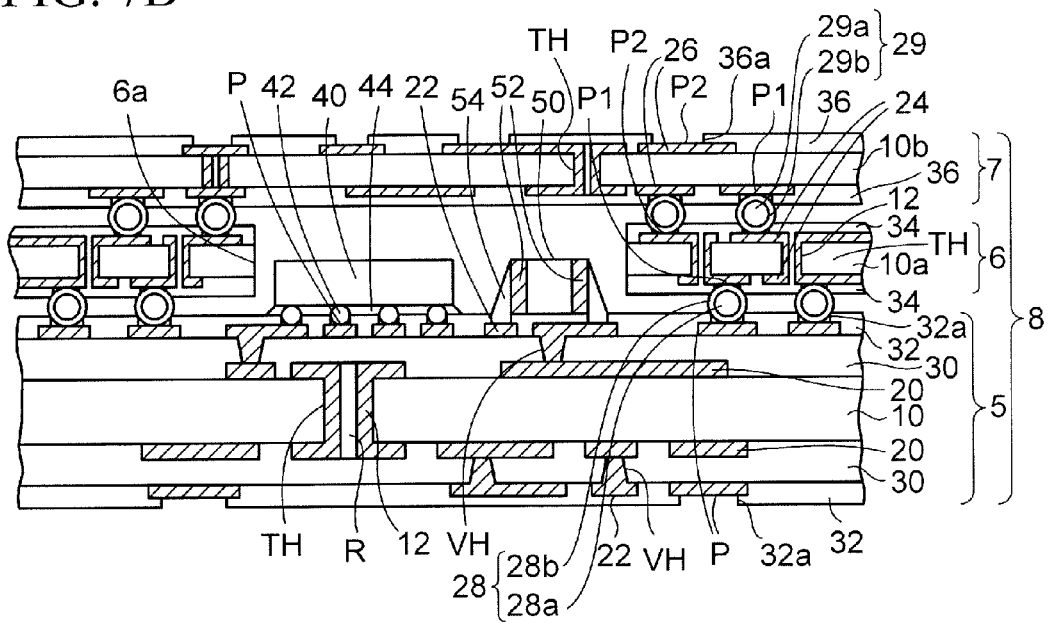

Then, as depicted in FIG. 7B, the second solder balls 29 on the lower surface side of the upper wiring substrate 7 in FIG. 7A are arranged on the second connection pads P2 on the upper surface side of the above-mentioned intermediate wiring substrate 6 in FIG. 6B, and then the reflow heating is applied. By this matter, the second solder balls 29 of the upper wiring substrate 7 are joined to the second connection pads P2 of the intermediate wiring substrate 6, and thus both members are electrically connected mutually.

In this way, the upper wiring substrate 7 is electrically connected to the lower wiring substrate 5 via the second solder balls 29 located under this upper wiring substrate 7, the intermediate wiring substrate 6, and the first solder balls 28 located under this intermediate wiring substrate 6.

With the above, a stacked wiring substrate 8 in which the upper wiring substrate 7 is stacked on the lower wiring substrate 5 via the intermediate wiring substrate 6 is obtained. As described above, the first and second connection pads P1, P2 on both surface sides of the intermediate wiring substrate 6 are arranged in the displaced positions mutually.

Therefore, the first and second solder balls 28, 29 arranged on the lower and upper sides of the intermediate wiring substrate 6 are also arranged in the displaced positions mutually to correspond to the above displaced positions.

Moreover, in the present embodiment, the first and second solder balls 28, 29 arranged on the lower and upper sides of the intermediate wiring substrate 6 are arranged to be displaced in the positions that are not mutually overlapped when viewed from the top, to correspond to the first and second connection pads P1, P2 in FIG. 5B.

In the present embodiment, the intermediate wiring substrate 6 is interposed between the lower wiring substrate 5 and the upper wiring substrate 7. Therefore, it is unnecessary to set diameters of the first and second solder balls 28, 29 larger than heights of the semiconductor chip 40 and the chip capacitor 50.

For example, in the case that respective heights of the semiconductor chip 40 including the bump electrodes 42 and the chip capacitor 50 are 300 μm, a thickness of the intermediate wiring substrate 6 is set to about 150 μm and diameters of the first and second solder balls 28, 29 arranged on the lower and upper sides of this intermediate wiring substrate 6 can be set to about 100 μm.

On the contrary, as explained in the preliminary matter, in the case that the intermediate wiring substrate 6 is not used, it is necessary to set the diameters of the solder balls to the value that is in excess of a height of the semiconductor chip 40: 300 μm.

In the present embodiment, by adjusting the thickness of the intermediate wiring substrate 6 with regard to the heights of the semiconductor chip and the chip capacitor 50, the first and second solder balls 28, 29 whose diameters are fairly smaller than a height of the semiconductor chip 40 can be employed. By this matter, a narrower pitch of the respective connection parts between the lower and upper wiring substrate 5, 7 can be achieved.

In this manner, to demand that a quantity of signal is increased with higher performance and higher integration of the semiconductor chip, the number of the connection routes can be easily increased by reducing the diameters of the first and second solder balls 28, 29.

Here, in the step of obtaining the above stacked wiring substrate 8, at first, in FIGS. 6A and 6B, the first solder balls 28 on the lower surface side of the intermediate wiring substrate 6 are connected to the connection pads P of the lower wiring substrate 5. After this, in FIGS. 7A and 7B, the second solder balls 29 on the lower surface side of the upper wiring substrate 7 are connected to the second connection pads P2 of the intermediate wiring substrate 6.

Besides this mode, at first, the second solder balls 29 on the lower surface side of the upper wiring substrate 7 in FIG. 7A are connected to the second connection pads P2 of the intermediate wiring substrate 6 in FIG. 6A, and thus a stacked wiring member is obtained.

After this, the first solder balls 28 on the lower surface side of the intermediate wiring substrate 6 of this stacked wiring member may be connected to the connection pads P of the lower wiring substrate 5. By employing this method, also the stacked wiring substrate 8 having the same structure as that in FIG. 7B can be obtained.

Also, in the above steps in FIGS. 6A and 6B, the first solder balls 28 may be joined to the connection pads P on the upper surface side of the lower wiring substrate 5, and then the first connection pads P1 on the lower surface side of the intermediate wiring substrate 6 may joined thereto.

Similarly, in the steps in FIGS. 7A and 7B, the second solder balls 29 may be joined to the second connection pad P2 on the upper surface side of the intermediate wiring substrate 6, and then the connection pads P1 on the lower surface side of the upper wiring substrate 7 may be jointed thereto.

Like this, such a stacked structure may be made that the intermediate wiring substrate including the opening portion, in which the electronic component is mounted, is connected to the lower wiring substrate via the conductive balls and that the upper wiring substrate is connected to the intermediate wiring substrate via the conductive balls. Therefore, in addition to the above manufacturing method in FIG. 6A to FIG. 7B, the manufacturing method according to the above variation, etc. can be employed.

Figure 8:
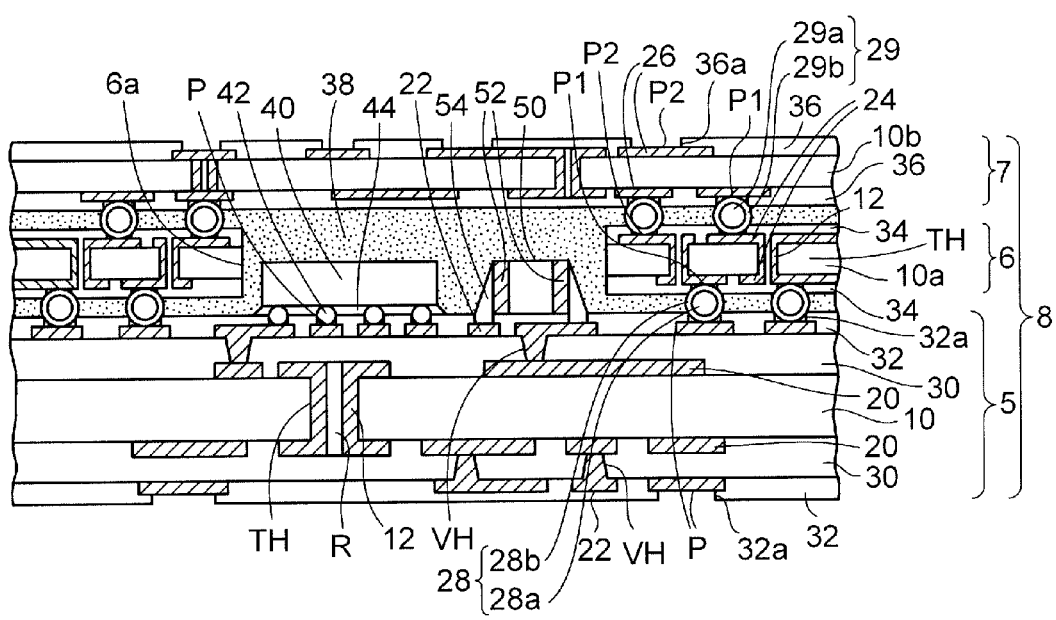
FIG. 8 is a sectional view (#5) depicting the method of manufacturing the electronic component built-in substrate according to the embodiment.

Then, as depicted in FIG. 8, a molding resin 38 is filled into respective areas between the lower wiring substrate 5, the intermediate wiring substrate 6, and the upper wiring substrate 7 of the stacked wiring substrate 8 in FIG. 7B.

In the step of filling the molding resin 38, as depicted in FIG. 9A, a molding die 60 including a lower die 62 and an upper die 64 is prepared. Then, the stacked wiring substrate 8 in FIG. 7B is arranged between the lower die 62 and the upper die 64, and the melted molding resin is injected from the resin supply portion A into respective areas in the stacked wiring substrate 8.

As explained in the preliminary matters as well, as depicted in FIG. 9A, in the case that an interval between the lower die 62 and the upper die 64 is wider than the designed value, it is in a state that a clearance G is produced between the upper wiring substrate 7 and the upper die 64. In this case, similarly to the preliminary matters, as depicted in FIG. 9B, the lower and upper wiring substrates 5, 7 are forced to expand by a pressure of the molding resin 38 applied at the time of injection, and thus the upper wiring substrate 7 is pushed toward the upper side.

However, in the present embodiment, as depicted in FIG. 9B, the first and second solder balls 28, 29 arranged on the lower and upper sides of the intermediate wiring substrate 6 are arranged in the displaced positions mutually. Also, rigidity of the intermediate wiring substrate 6 is weakened by the heating process applied at a temperature: 170° C. to 180° C. when the molding resin 38 is injected.

By this matter, when the upper wiring substrate 7 is pushed toward the upper side, the intermediate wiring substrate 6 connected to the upper wiring substrate 7 via the second solder balls 29 follows this pushing force and bends upward so as to wave.

In this manner, the force that the upper wiring substrate 7 is pushed upward can be absorbed by the matter that the intermediate wiring substrate 6 bends upward.

Accordingly, even though the clearance G is produced between the upper wiring substrate 7 and the upper die 64, such an event can be prevented that the first and second solder balls 28, 29 are separated from the lower wiring substrate 5 and the intermediate wiring substrate 6. By this matter, reliability of the electrical connection between the lower wiring substrate 5 and the upper wiring substrate 7 can be improved.

Also, on the contrary, in FIG. 10, the case that an interval between the lower die 62 and the upper die 64 is narrower than the designed value is depicted. In this case, the upper wiring substrate 7 is pushed downward more than the necessity by the upper die 64.

However, in the present embodiment, the first and second solder balls 28, 29 arranged on the lower and upper sides of the intermediate wiring substrate 6 are arranged in the displaced positions mutually, and also rigidity of the intermediate wiring substrate 6 is rendered weak by the heating process applied when the molding resin 38 is injected.

Therefore, when the upper wiring substrate 7 is pushed downward more than the necessity, the intermediate wiring substrate 6 bends upward so as to wave and is capable of absorbing this pushing force. By this matter, the first and second solder balls 28, 29 on the lower and upper sides of the intermediate wiring substrate 6 are not crashed, and also the cracks are not generated in solder resists 32, 34, 36 located to the periphery of the solder balls 28, 29.

In particular, in the case that the pushing force applied to the upper wiring substrate 7 is large, it is made to a state that the intermediate wiring substrate 6 can bend up and down sufficiently, and can absorb this pressure. That is, it is preferable that a displaced distance between the first and second solder balls 28, 29 on the lower and upper sides is set so as to exceed the diameters of the solder balls 28, 29 and so that these solder balls are arranged not to overlap mutually.

In this manner, the molding resin 38 can be filled in the areas between the lower wiring substrate 5, the intermediate wiring substrate 6, and the upper wiring substrate 7 with good reliability. By the filling of the molding resin 38, even though either an impact such as a falling, or the like is applied to the electronic component built-in substrate, or warp is caused in it by thermal stress, the electrical disconnection between the wiring substrates can be prevented.

Then, as depicted in FIG. 11, as the upper electronic component, a semiconductor device 70 having solder bumps 72 is prepared. Then, the solder bumps 72 of the semiconductor device 70 are arranged on the connection pads P of the upper wiring substrate 7, and then are joined to them by applying the reflow heating.

At this time, the first and second solder balls 28, 29 arranged on the lower and upper sides of the intermediate wiring substrate 6 are melted again. However, since no crack is generated in the solder resists 32, 34 which contact the first and second solder balls 28, 29, there is no risk that the electrical short-circuit between the first solder balls 28 or the second solder balls 29 is generated.

After this, an underfill resin 74 is filled into a clearance under the semiconductor device 70.

For example, in the case that the semiconductor chip 40 mounted on the above lower wiring substrate 5 is CPU, a memory is employed as the semiconductor device 70.

Further, an external connection terminal 14 is provided onto the connection pads P on the lower surface side of the lower wiring substrate 5 respectively by mounting the solder ball, or the like.

With the above, an electronic component built-in substrate 1 according to the embodiment is obtained.

Here, in the case that the large size lower wiring substrate 5 for the purpose of multi production is used, the resultant structure is cut from the upper surface of the upper wiring substrate 7 to the lower surface of the lower wiring substrate 5 at a predetermined stage, and thus individual electronic component built-in substrates 1 are obtained.

As depicted in FIG. 11, in the electronic component built-in substrate 1 according to the embodiment, the bump electrodes 42 of the semiconductor chip 40 are flip-chip connected to the connection pads P in the component mounting area A of the lower wiring substrate 5 explained in FIG. 4A. The underfill resin 44 is filled into a clearance under the semiconductor chip 40.

The chip capacitor 50 having the connection terminal 52 on both end sides is adhered onto the solder resist 32 of the lower wiring substrate 5 in the lateral direction of the semiconductor chip 40. The connection terminals 52 on both end sides of the chip capacitor 50 are connected to the connection pads P of the lower wiring substrate 5 via the solder layer 54.

The intermediate wiring substrate 6 shaped like a frame and explained in FIGS. 5A to 5C is arranged in the periphery of the semiconductor chip 40 and the chip capacitor 50. The intermediate wiring substrate 6 has the opening portion 6a, which penetrates from the upper surface to the lower surface, in the center part, and the semiconductor chip 40 and the chip capacitor 50 are mounted in this opening portion 6a.

The first connection pads P1 on the lower surface side of the intermediate wiring substrate 6 are electrically connected to the connection pads P of the lower wiring substrate 5 via the first solder ball 28.

Also, the upper wiring substrate 7 is arranged over the semiconductor chip 40, the chip capacitor 50, and the intermediate wiring substrate 6. The second connection pads P2 on the upper surface side of the intermediate wiring substrate 6 are electrically connected to the first connection pads P1 on the lower surface side of the upper wiring substrate 7 via the second solder balls 29.

Further, the molding resin 38 sealing the semiconductor chip 40 and the chip capacitor 50 is filled into respective areas between the lower wiring substrate 5, the intermediate wiring substrate 6, and the upper wiring substrate 7.

Also, the solder bumps 72 of the semiconductor device 70 are connected to the second connection pads P2 on the upper surface side of the upper wiring substrate 7. The underfill resin 74 is filled into a clearance under the semiconductor device 70. Further, the external connection terminals 14 are provided on the connection pads P on the lower surface side of the lower wiring substrate 5.

In the electronic component built-in substrate 1 of the present embodiment, by interposing the intermediate wiring substrate 6 between the lower wiring substrate 5 and the upper wiring substrate 7, the respective diameters of the first and second solder balls 28, 29 can be made small. By this matter, arrangement pitches of the first and second solder balls 28, 29 can be made narrower.

Accordingly, to the demand that the quantity of signal is increased with higher performance and higher integration of the semiconductor chip, the number of connection routes can be easily increased.

Also, in the electronic component built-in substrate 1 of the present embodiment, the first and second solder balls 28, 29 arranged on the lower and upper side of the intermediate wiring substrate 6 are arranged in the displaced positions mutually. By this matter, as described above, even though the pressure is applied in the upper and lower direction when filling the molding resin 38 at the time of manufacture, the intermediate wiring substrate 6 bends to follow the pressure so that the pressure can be absorbed.

In this manner, it can be prevented that, when filling the molding resin 38, the first and second solder balls 28, 29 are separated from the lower wiring substrate 5 and the intermediate wiring substrate 6 and are forced electrically open. Therefore, the molding resin 38 can be filled with good reliability. By this matter, the electronic component built-in substrate 1 in which the reliability of the electrical connection is high can be manufactured with good yield.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing an electronic component built-in substrate, comprising:
mounting an electronic component on a lower wiring substrate;
obtaining a stacked wiring substrate having a structure that an intermediate wiring substrate in which an opening portion housing the electronic component is provided, is connected to the lower wiring substrate via a first conductive ball, and that an upper wiring substrate is connected to the intermediate wiring substrate via a second conductive ball;
sealing the electronic component by filling a resin into respective areas between the lower wiring substrate, the intermediate wiring substrate, and the upper wiring substrate; and
wherein the first conductive ball and the second conductive ball are arranged in displaced positions mutually.

(Clause 2) A method of manufacturing an electronic component built-in substrate, according to clause 1, wherein the obtaining the stacked wiring substrate includes,
connecting the intermediate wiring substrate to the lower wiring substrate via the first conductive ball, and
connecting the upper wiring substrate to the intermediate wiring substrate via the second conductive ball.

(Clause 3) A method of manufacturing an electronic component built-in substrate, according to clause 1, wherein the first conductive ball and second conductive ball are arranged in positions that are not overlapped mutually, when viewed from a top.

(Clause 4) A method of manufacturing an electronic component built-in substrate, according to clause 1, wherein each diameter of the first conductive ball and the second conductive ball is set smaller than a height of the electronic component.

(Clause 5) A method of manufacturing an electronic component built-in substrate, according to clause 1, wherein at least each outer face of the first conductive ball and the second conductive ball is formed of a solder layer.

What is claimed is:

1. An electronic component built-in substrate, comprising:
a lower wiring substrate;
an electronic component mounted on the lower wiring substrate;
an intermediate wiring substrate including an opening portion in which the electronic component is mounted, and arranged in a periphery of the electronic component, and connected to the lower wiring substrate via a first conductive ball;
an upper wiring substrate arranged over the electronic component and the intermediate wiring substrate, and connected to the intermediate wiring substrate via a second conductive ball; and
a resin filled into respective areas between the lower wiring substrate, the intermediate wiring substrate, and the upper wiring substrate, and sealing the electronic component,
wherein the first conductive ball and the second conductive ball are arranged in displaced positions mutually, and
the first conductive ball and the second conductive ball are arranged in positions that are not overlapped mutually, when viewed from a top.

2. An electronic component built-in substrate according to claim 1, wherein each diameter of the first conductive ball and the second conductive ball is set smaller than a height of the electronic component.

3. An electronic component built-in substrate according to claim 1, wherein the intermediate wiring substrate is formed to be linked with a frame shape.

4. An electronic component built-in substrate according to claim 1, wherein at least each outer face of the first conductive ball and the second conductive ball is formed of a solder layer.

* * * * *